United States Patent
Chennupati

(10) Patent No.: US 6,917,100 B2
(45) Date of Patent: Jul. 12, 2005

(54) CIRCUIT MODULE HAVING INTERLEAVED GROUPS OF CIRCUIT CHIPS

(75) Inventor: Siva Chennupati, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/785,140

(22) Filed: Feb. 24, 2004

(65) Prior Publication Data

US 2004/0222507 A1 Nov. 11, 2004

(30) Foreign Application Priority Data

May 8, 2003 (EP) .............................. 03010411

(51) Int. Cl.[7] .......................... H01L 23/02; H01L 23/34
(52) U.S. Cl. .................... 257/686; 257/685; 257/724
(58) Field of Search ................................ 257/685, 686, 257/723, 724

(56) References Cited

U.S. PATENT DOCUMENTS

| | | | |
|---|---|---|---|
| 4,587,594 A | 5/1986 | McPherson | |
| 5,003,370 A | 3/1991 | Kashiwagi | |
| 6,542,393 B1 | 4/2003 | Chu et al. | |
| 2002/0074639 A1 * | 6/2002 | Kim et al. | 257/686 |
| 2003/0089978 A1 * | 5/2003 | Miyamoto et al. | 257/723 |
| 2003/0137041 A1 * | 7/2003 | Blackshear et al. | 257/686 |
| 2004/0104469 A1 * | 6/2004 | Yagi et al. | 257/723 |

FOREIGN PATENT DOCUMENTS

WO    WO 01/37090 A1    5/2001

* cited by examiner

Primary Examiner—Ngân V. Ngô
(74) Attorney, Agent, or Firm—Slater & Matsil, L.L.P.

(57) ABSTRACT

A circuit module has a carrier (10) and multiple stacks of circuit chips arranged on a surface of the carrier. Each stack has multiple circuit chips arranged in different layers. The circuit chips are grouped in different groups, wherein the groups are not active at the same time. The circuit chips are arranged such that circuit chips belonging to the same group are arranged in different layers in adjacent stacks.

7 Claims, 1 Drawing Sheet

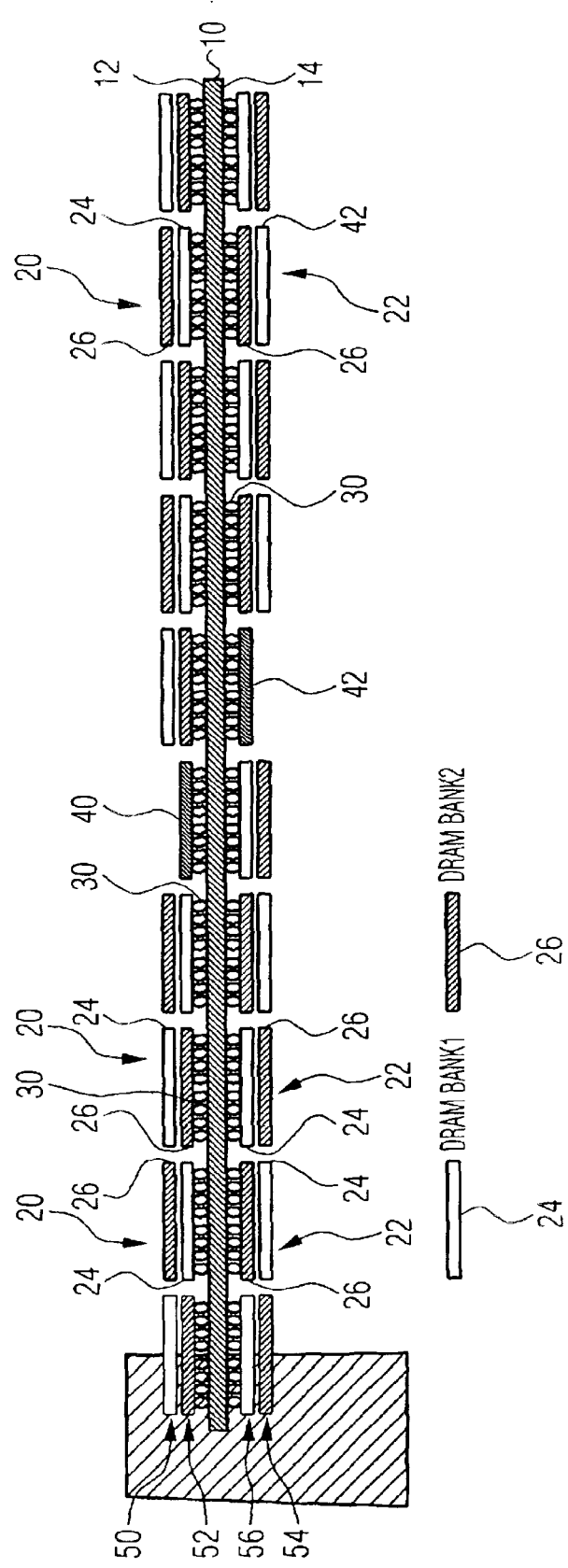

CIRCUIT MODULE HAVING INTERLEAVED GROUPS OF CIRCUIT CHIPS

BACKGROUND OF THE INVENTION

1. Field of the Invention

The present invention relates to a circuit module and, in particular, to a circuit module comprised in a carrier and decks of circuit chips arranged on the carrier, wherein the circuit chips are grouped in different groups which are active at different times.

2. Description of the Invention

A conventional structure of memory modules, DIMMs (DIMM=Dual In-Line Memory Module), for example, includes a module board and groups of memory chips, DRAM chips, for example, arranged on the module board. In high-density memory modules, the memory chips are stacked on the module board, wherein each stack contains multiple memory chips stacked on top of each other. Usually, each stack comprises two memory chips, one arranged in a first layer and one arranged in a second layer of the stack.

In such a prior art memory module, the memory chips are grouped into two banks of memory chips, wherein only one bank of memory chips is active at a time. The memory chips of the active bank are selected by way of a bank select signal. In the above prior art memory module, the arrangement of the memory chips is such that the memory chips belonging to a first bank are arranged in the first layer (the bottom layer, for example) of the stacks of memory chips, whereas the memory chips belonging to the second bank are arranged in the second layer (the top layer, for example) of the stacks of memory chips.

The power dissipation in such high-density memory modules is very high. The arrangement of the memory chips explained above, wherein memory chips belonging to the same memory bank are arranged in the same layer, the dissipation of heat is difficult. Thus, the temperature of the memory module can reach 80° C. to 90° C. Especially, if the bank of the bottom chips is active, the heat convection to the surrounding air is very bad. This may result in a breakdown of memory chips and, therefore, of the memory module.

SUMMARY OF THE INVENTION

It is the object of the present invention to provide a variable circuit module having a high-density arrangement of circuit chips.

In accordance with an aspect, the present invention provides a circuit module having a carrier, stacks of circuit chips arranged on a surface of the carrier and including several circuit chips arranged in different layers, wherein the circuit chips are grouped in different groups, wherein the groups are not active at the same time, wherein the circuit chips are arranged such that circuit chips belonging to the same group are arranged in different layers in adjacent stacks.

The present invention is based on the finding that an arrangement of circuit chips of a circuit module such that adjacent circuit chips in the same layer are not active at the same time can be advantageously used in order to make the power dissipation on the circuit module more even.

According to the inventive arrangement, the circuit chips are interleaved such that chips adjacent to each other in each stack or chips adjacent to each other in each layer belong to different groups which are not active at the same time.

Therefore, according to the invention, chips that are not active, i.e. cooler chips, are arranged between active chips, so that the maximum temperature to which the module is heated can be lowered.

Stacks of circuit chips can be arranged on both main surfaces of the carrier which can be formed by a circuit board. In such a case, it is preferred that those circuit chips opposite to each other with the circuit board arranged therebetween belong to different groups.

According to preferred embodiments of the invention, the circuit module is a memory module (a DIMM, for example) and the circuit chips are memory chips (DRAMs, for example). In such a memory module, the memory chips are grouped in different memory banks (DRAM banks, for example). Only one of the different memory banks is active at a time, wherein the memory chips belonging to a memory bank are activated, making use of a bank select signal when the associated memory bank is active.

Thus, the present invention allows for an improved power dissipation on the circuit module compared to conventional solutions, making use of a special arrangement of the circuit chips which are active at the same time. This makes the power dissipation on the module more even and gives enough area and time for heat convection to the surrounding air. This permits to operate a certain module at lower temperatures, which improves the performance and error rate of the circuit module. In addition, the arrangement according to the preferred embodiment of the invention does not represent additional costs when compared to prior art solutions.

A preferred embodiment of the present invention is described hereinafter, making reference to the appended drawing.

BRIEF DESCRIPTION OF THE DRAWINGS

These and other objects and features of the present invention will become clear from the following description taken in conjunction with the accompanying drawing, in which:

FIG. 1 shows a schematic view of a memory module embodying the present invention.

DESCRIPTION OF THE PREFERRED EMBODIMENT

FIG. 1 shows a schematic view of a memory module in the form of a registered DIMM representing a circuit module according to the invention. The memory module comprises a module board 10 having a first main surface 12 and a second main surface 14 opposite to the first main surface 12. Stacks 20 of memory chips are formed on the first main surface 12 and stacks 22 are formed on the second main surface 14. To be more specific, in the embodiment shown in FIG. 1, nine stacks 20 are formed on the main surface 12 and nine stacks 22 are formed on the second main surface 14.

Each of the stacks 20 and 22 comprise two circuit chips 24 and 26. The circuit chips 24 belong to a first DRAM bank, DRAM Bank 1, whereas the memory chips 26, which are indicated by hatching in FIG. 1, belong to a second DRAM bank, DRAM Bank 2.

The respective stacks of memory chips can be implemented in a manner known to a man of ordinary skill such that respective terminals of the memory chips which are schematically shown in FIG. 1 and indicated by the reference number 30, are connected to respective terminals on the circuit board 10 so that the electrical connections for operating the memory chips are achieved. Moreover, registers 40 and 42 arranged on the first and the second main surface 12 and 14 of the circuit board 10 are shown in FIG. 1.

As can be seen from FIG. 1, according to the invention, the circuit chips 24 belonging to DRAM Bank 1 are alternately arranged in an top layer 50 and a bottom layer 52 of the stacks 20. Similarly, the circuit chips 26 belonging to DRAM Bank 2 are alternately arranged in the top layer 50 and the bottom layer 52. Thus, the memory chips of two adjacent stacks belonging to the same bank are arranged in different layers.

In the same manner, the circuit chips 24 and 26 of the stacks 22 arranged on the second main surface 14 of the circuit board 10 are alternately arranged in a top layer 54 and a bottom layer 56 of the stacks 22. Thus, the circuit chips of the stacks 22 are interleaved in the same manner as the circuit chips of the stacks. Moreover, the circuit chips of stacks 20 and 22 which are opposite to each other with the module board disposed therebetween are arranged such that the memory chips directly opposing each other belong to different DRAM banks. Thus, the interleaved arrangement of the memory chips shown in FIG. 1 is achieved in which, in both directions, parallel to the module board 10 and normal thereto, respectively adjacent memory chips belong to different memory banks, so that the advantageous heat dissipation according to the invention is achieved.

In operation, the controlling of the memory chips is identical to that of prior art memory modules having stacked chips, with the exception that, according to the present invention, the memory chips are controlled such that the respective active chips belonging to the same memory bank are interleaved in the manner described above.

Also the present invention has been described above, making reference to memory modules, it is clear that the present invention can also be used in connection with other circuit modules which comprise stacks of circuit chips. In addition, each stack of circuit chips can have more than two circuit chips belonging to two or more different groups of circuit chips. In either case, the arrangement of the circuit chips is such that memory chips in the same layer of adjacent stacks belong to a different group. In addition, the arrangement will be such that adjacent memory chips in the same stack belong to different groups which are not active at the same time. Thus, since adjacent chips always belong to different banks and the different banks are not active at the same time, the heat generated by the chips is evenly distributed among the chips in the stacks, so that the maximum temperature to which the module, or parts of the module are heated, can be reduced.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit module comprising:

A carrier;

stacks of circuit chips arranged on a surface of the carrier and including several circuit chips arranged in different layers, wherein the circuit chips are grouped in different groups, wherein the groups are not active at the same time, wherein the circuit chips are arranged such that circuit chips belonging to the same group are arranged in different layers in adjacent stacks.

2. Circuit module according to claim 1, wherein stacks of circuit chips are arranged on a first surface and a second surface of the carrier.

3. Circuit module according to claim 1, wherein the circuit module is a memory module and the circuit chips are memory chips.

4. Circuit module according to claim 3, wherein the memory module is a DIMM and the memory chips are DRAMs.

5. Circuit module according to claim 3, wherein the groups into which the circuit chips are grouped are respective memory banks.

6. Circuit module according to claim 1, further comprising means to activate the circuit chips belonging to the same group.

7. Circuit module according claim 6, wherein the means to activate the circuit chips belonging to the same group comprises a bank select signal.

* * * * *